(12) United States Patent
Lamprecht

(10) Patent No.: US 11,399,441 B2
(45) Date of Patent: Jul. 26, 2022

(54) SECURITY ENCLOSURE

(71) Applicant: ALLBRO (PTY) LTD, Boksburg (ZA)

(72) Inventor: Quintin Lamprecht, Boksburg (ZA)

(73) Assignee: ALLBRO (PTY) LTD, Boksburg (ZA)

( * ) Notice: Subject to any disclaimer, the term of this patent is extended or adjusted under 35 U.S.C. 154(b) by 215 days.

(21) Appl. No.: 16/957,071

(22) PCT Filed: Dec. 20, 2018

(86) PCT No.: PCT/IB2018/060403
§ 371 (c)(1),
(2) Date: Jun. 22, 2020

(87) PCT Pub. No.: WO2019/123352
PCT Pub. Date: Jun. 27, 2019

(65) Prior Publication Data
US 2021/0100113 A1 Apr. 1, 2021

(30) Foreign Application Priority Data
Dec. 21, 2017 (ZA) .................................. 2017/08734

(51) Int. Cl.
*H05K 5/02* (2006.01)
(52) U.S. Cl.
CPC ......... *H05K 5/0208* (2013.01); *H05K 5/0221* (2013.01)
(58) Field of Classification Search
None
See application file for complete search history.

(56) References Cited

U.S. PATENT DOCUMENTS

| 5,145,087 A | 9/1992 | Weger, Jr. |
| 5,310,075 A | 5/1994 | Wyler |

(Continued)

FOREIGN PATENT DOCUMENTS

| CN | 201125009 Y | 10/2008 |
| WO | WO-2011/011821 A1 | 2/2011 |

OTHER PUBLICATIONS

Keystone Electronic Solutions: "Unique digital lock combines GSM, GPS and induction to provide robust remote locking solution", Feb. 21, 2013 (Feb. 21, 2013), pp. 1-4, XP002790545, Retrieved from the Internet: URL:http://www.kses.net/media/20130221%20Unique%20digital%20lock%20combines%20GSM,%20GPS%20and%20induction.pdf; the whole document.

(Continued)

*Primary Examiner* — Xanthia C Cunningham
(74) *Attorney, Agent, or Firm* — Harness, Dickey & Pierce, P.L.C.

(57) ABSTRACT

This invention concerns a security enclosure and in particular an outdoor, non-metallic security enclosure for electrical equipment. The enclosure has a body and a cover which is connected to the body using connecting means such that the cover is movable between a first, closed position wherein the security enclosure is closed and a second, open position wherein the security enclosure is open. The cover is lockable in its closed position. Complementary shaped engagement formations carried by the body and cover engage one another so as to create a mechanical seal between the body and cover when the cover is in its closed position. Retaining formations carried by the body and cover respectively are configured to prevent the cover from being removed from the body when the cover is in its closed position. The invention also concerns a security system including a number of security enclosures.

20 Claims, 9 Drawing Sheets

(56) References Cited

U.S. PATENT DOCUMENTS

| | | | | |
|---|---|---|---|---|
| 5,845,433 | A | 12/1998 | Walsh | |
| 7,413,479 | B1 * | 8/2008 | Volpone | H01R 13/506 |
| | | | | 439/352 |
| 8,113,853 | B2 * | 2/2012 | Coyle, Jr. | H02S 40/345 |
| | | | | 439/482 |
| 8,648,264 | B2 * | 2/2014 | Masumoto | H02G 3/14 |
| | | | | 220/281 |
| 9,609,763 | B2 * | 3/2017 | Gerst | E05C 19/06 |
| 9,617,047 | B2 * | 4/2017 | Goettke | B65D 43/0204 |
| 10,479,563 | B2 * | 11/2019 | Tramm | H02G 9/10 |
| 10,547,168 | B2 * | 1/2020 | Tipton | H02G 9/10 |
| 2009/0200056 | A1 * | 8/2009 | Moran | H02G 9/10 |
| | | | | 248/221.11 |
| 2016/0046440 | A1 * | 2/2016 | Freeman | H02G 9/10 |
| | | | | 220/324 |
| 2019/0305406 | A1 * | 10/2019 | Williams | H05K 7/186 |

OTHER PUBLICATIONS

International Search Report and Written Opinion of the ISA for International Application No. PCT/IB2018/060403, dated May 29, 2019; ISA/EPO.

International Preliminary Report on Patentability for International Application No. PCT/IB2018/060403, completed Jun. 8, 2020.

* cited by examiner

SECURITY ENCLOSURE

CROSS-REFERENCE TO RELATED APPLICATIONS

This application is a 371 U.S. National Stage of International Application No. PCT/IB2018/060403, filed on Dec. 20, 2018, which claims priority to South African Application No. 2017/08734, filed on Dec. 21, 2017. The entire disclosures of the above applications are incorporated herein by reference.

BACKGROUND TO THE INVENTION

This invention relates to a security enclosure. More particularly, but not exclusively, the invention relates to an outdoor, non-metallic security enclosure for electrical equipment.

Security enclosures for electrical equipment are well-known and many variations are available in the market. However, there are many challenges to designing a security enclosure, particularly an outdoor enclosure. Vandalism is a growing global concern and enclosures are typically vandalised due to the high value of enclosure content, to bypass a smart meter, to disable a surveillance system or simply to strip the contents for sale on the black market. Although some of the known enclosures provide security features, these features are often by-passed with relative ease. For example, known enclosures are often vandalised by compromising their hinges in order to by-pass high security locks.

Access control is often affected in that ease of access for authorised personnel is adversely affected when addressing the vandalism challenge. Monitoring and tracking of access by authorised personnel are important as it has been found that criminal elements sometimes gain 'authorised' access to the enclosures.

Addressing the vandalism challenge also often raises the risk associated with human contact and shock. The vandalism challenge is typically addressed by including metallic components for reinforcement. However, the inclusion of metallic components increases the risk of personnel and the general public coming into contact with live electrical circuits. Also, when such an enclosure is mounted on a pole, for example, the risk to the person working at height is exacerbated. However, the use of non-metallic enclosures brings new challenges in respect of UV resistance and weatherability. Accelerated UV testing is primarily a measure of colour degradation. However, real life exposure has to cope with temperature cycling, rain and particulate rich wind. International standards do not currently exist to test this, leaving real life long-term field trials to provide the only genuine test of an enclosure's ability to withstand the elements.

Another challenge when designing outdoor enclosures, in particular non-metallic enclosures for use in housing electrical equipment, is to get the desired IP Levels for water and dust. It is well-known that electrical systems fail because of three main factors, namely temperature, water and dust. The latter two are addressed by the international standard IEC60529 (SANS IEC 60529). One drawback of many enclosures is that they simply do not seal reliably in order to meet the SANS standards consistently. As a result, equipment failures are often encountered when using these known enclosures that do not provide adequate IP Levels.

Yet another challenge when designing non-metallic enclosures is that of flammability. Although some plastic materials provide good impact resistance, they often provide very little resistance to flammability. For obvious reasons, a flammable plastics material cannot be used in security enclosures that form part of an electrical network. Ideally all enclosures used for housing electrical equipment or forming part of an electrical network should be non-flammable or, at the very least, be self-extinguishing. Most utility companies require compliance to IEC 62208, which stipulates the parameters of glow wire testing and flammability, in order to address vandalism. These materials may provide good resistance to impact but do not address the flammability challenge. Accordingly, vandals can easily destroy the enclosure by setting it alight.

When using non-metallic materials in the manufacture of the enclosure another factor that has to be taken in to account in the design phase is the weight of the enclosure. Whilst modern composites constantly deliver greater strength to weight performance there is no way of getting around the fact that weight is added when increasing the strength of a mechanical part. Considering that enclosures are frequently installed on upright poles or wall structures, it is important to keep the weight of the enclosure down to a level that does not compromise the integrity of the pole or wall structure. Keeping the weight down also facilitates installation of the enclosure at these elevated positions.

It has also been found that some non-metallic materials cause signal interference. These materials create a Faraday cage effect and interfere with signals that form part of the function of the equipment installed in the enclosure. For example, an antenna that is mounted outside an enclosure is a vulnerable point and is often affected when interference takes place. This is obviously unwanted as the performance of the electrical installation is affected.

A person skilled in the art will know that designing for the above challenges is complicated and the resulting solutions are generally expensive. Known enclosures that aim to address these challenges are in many instances prohibitively expensive. As a result, inferior enclosures may be installed, which compromises the electrical system. Electrical systems that are bypassed or out of order represent enormous loss in revenue that can never be recovered.

It is an object of this invention to alleviate at least some of the problems experienced with existing security enclosures. It is a further object of the invention to provide a security enclosure, in particular but not exclusively an outdoor non-metallic enclosure, and/or a security system including a security enclosure which address(es) the above-mentioned design challenges.

It is yet a further object of this invention to provide a security enclosure that will be a useful alternative to existing enclosures.

SUMMARY OF THE INVENTION

In accordance with a first aspect of the invention there is provided a security enclosure including:
  a body;
  a cover which is connected to the body using connecting means such that the cover is movable between a first, closed position wherein the security enclosure is closed and a second, open position wherein the security enclosure is open;
  locking means for locking the cover in its closed position;
  complementary shaped engagement formations carried by the body and cover that engage one another so as to create a mechanical seal between the body and cover when the cover is in its closed position; and retaining formations carried by the body and cover respectively, the retaining formations being configured to prevent the cover from being removed from the body when the cover is in its closed position.

The cover may have an obstructing formation that extends beyond the interface between the body and cover when the cover is in its closed position, thereby obstructing access to the interface between the body and cover.

The obstructing formation may be in the form of an exaggerated lip which at least partially conceals the connecting means connecting the body and cover to one another.

The cover may be connected to the body by means of at least one hinge, and wherein the lip is carried by a rear edge of the cover such that it extends at least partially over the hinge so that access to the hinge is obstructed by the lip.

The engagement formations may run along at least a major portion of the periphery of the body and cover. In one embodiment the engagement formations run along three sides of the enclosure.

The engagement or contact surfaces of the engagement formations may create an interface between the body and cover when the cover is in its closed position, and wherein the interface between the body and cover is concealed so as to obstruct access thereto.

The engagement formations may be in the form of at least one ridge which is received in a complementary shaped groove when the body and cover engage each other, wherein the engagement formation defining the groove has an internal rim and an external rim between which the groove is located, and wherein the engagement formation defining the ridge has shoulders which are shaped complementary to the internal and external rims.

The profiles of the contact surfaces between the engagement formations are preferably curved so as to enhance the integrity of the mechanical seal created by them.

The mechanical seal created by the complementary shaped engaging formations is preferably free from a gasket.

The mechanical seal created by the complementary shaped engaging formations is preferably IP Level 66 compliant.

The locking means may be in the form a mechanical lock that includes a coded nut and a magnetic cap which, in use, fits over the coded nut such that access to the coded nut is only gained once the magnetic cap is removed.

The locking means may include a second lock, which is preferably key operated.

The locking means may provide for central access control and tracking.

The locking means may include a dock and trace key system that allows for tracking from a central location.

The locking means may form part of a live GPS based access control system.

The locking means may be in the form of a GridLock Access Management (GLAM) lock that is operable using a smart key that is tracked using GPS.

The smart key is preferably connectable to mobile communication devices for communication with a centralised management platform.

The security enclosure is preferably manufactured from a non-metallic material, such as fibreglass reinforced polyester, for example.

The security enclosure may include a stay for holding the cover in its open position, wherein the stay includes a pneumatic cylinder which is movable between a first, supporting position wherein the cover is supported in its open position and a second, contracted position wherein the cover is in its closed position, and wherein the stay is biased to its locking position such that it automatically holds the cover in its open position when opening the cover.

In accordance with a second aspect of the invention there is provided a security system including:
 a number of security enclosures, preferably according to the first aspect of the invention, wherein the locking means of each enclosure is coded;
 a number of coded tools for operating the coded locking means, wherein the coded tools correspond to the number of coded locking means such that each uniquely coded locking means has a corresponding tool for operating the coded locking means between its locked and open states; and
 a database containing information for mapping the security enclosures and their coded locking means against the corresponding coded tool required to operate the locking means of each security enclosure.

The locking means may include a coded nut and the coded tool may be a complementary shaped mechanical tool for engaging the coded nut.

In accordance with a third aspect of the invention there is provided a security system including a number of security enclosures, preferably according to the first aspect of the invention, wherein the locking means is in the form of a GridLock Access Management (GLAM) lock that is operable using a smart key that is connectable to a mobile communication device for communication with a central access control system for controlling access to the security enclosures based on the geographic data of the smart key and/or mobile device.

In accordance with a fourth aspect of the invention there is provided a method of mounting a security enclosure, the method including:
 providing a security enclosure;
 providing attachment points;
 attaching hoisting equipment to the attachment points and hoisting the box to the desired position;
 fixing a bracket carried by the security enclosure to the structure against which the security enclosure is to be mounted The method of mounting the security enclosure may further include the following steps:
 attaching a first bracket to the security enclosure,
 attaching a second bracket to the structure against which the security enclosure is to be mounted; and
 attaching the first bracket to the second bracket such that the security enclosure is suspended from the second bracket mounted on the structure, thereby allowing the installer to use both hands to secure the security enclosure in place.

It is envisaged that in one embodiment of the mounting method the security enclosure may be hoisted and mounted to the structure while still in the box.

BRIEF DESCRIPTION OF THE DRAWINGS

The invention will now be described in more detail, by way of example only, with reference to the accompanying drawings in which.

DESCRIPTION OF THE ILLUSTRATED EMBODIMENT

Figure 1:
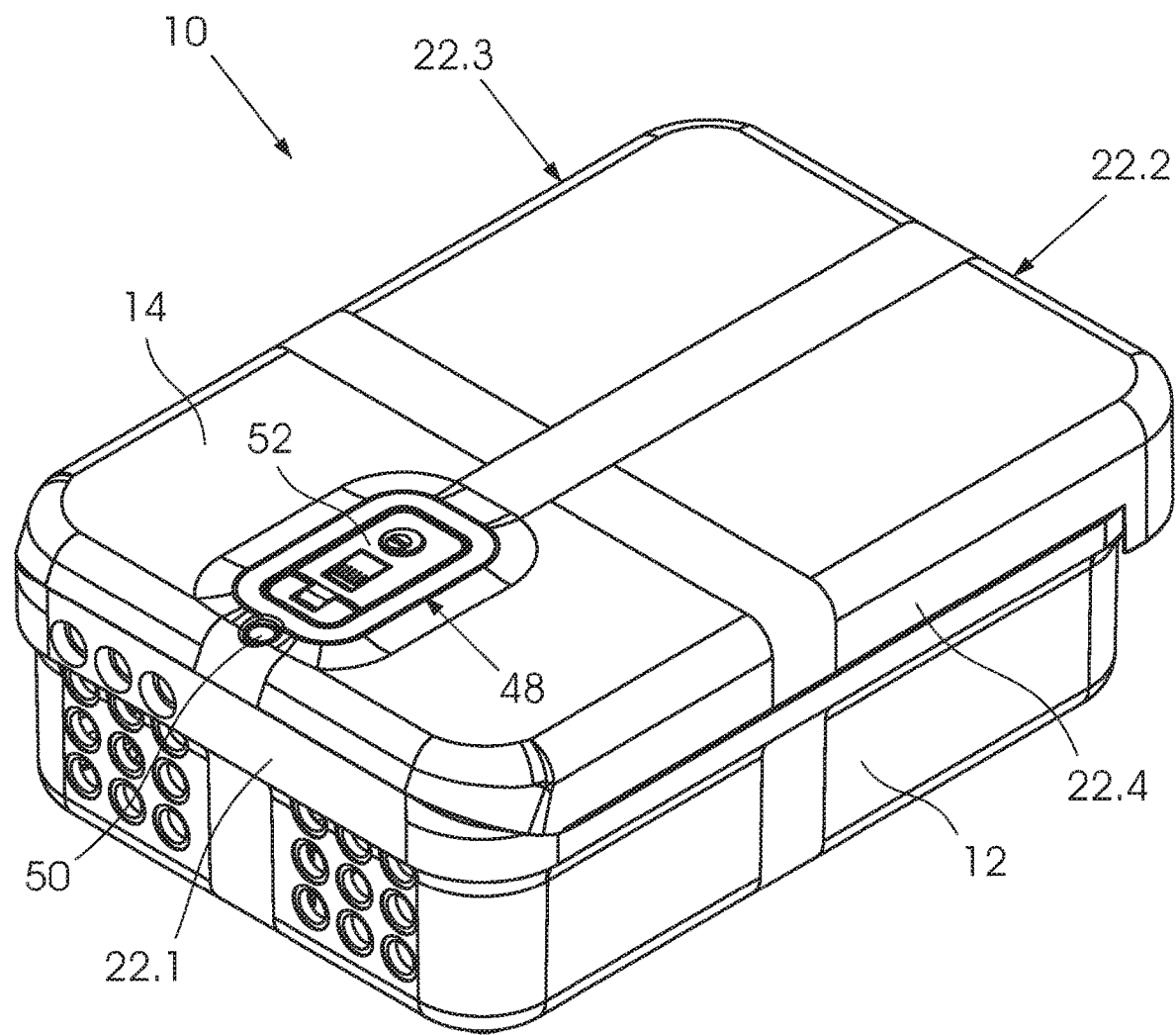
FIG. 1 shows a first front, top perspective view of a security enclosure in accordance with the invention.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings and are thus intended to include direct connections between two members without any other members interposed therebetween and indirect connections between members in which one or more other members are interposed therebetween. Further, "connected" and "coupled" are not restricted to physical or mechanical connections or couplings. Additionally, the words "lower", "upper", "upward", "down" and "downward" designate directions in the drawings to which reference is made. The terminology includes the words specifically mentioned above, derivatives thereof, and words or similar import. It is noted that, as used in this specification and the appended claims, the singular forms "a," "an," and "the," and any singular use of any word, include plural referents unless expressly and unequivocally limited to one referent. As used herein, the term "include" and its grammatical variants are intended to be non-limiting, such that recitation of items in a list is not to the exclusion of other like items that can be substituted or added to the listed items.

Referring to the drawings, in which like numerals indicate like features, a non-limiting example of a security enclosure in accordance with the invention is generally indicated by reference numeral 10.

It is envisaged that the security enclosure 10 would be particularly useful as an outdoor enclosure for housing equipment forming part of an electrical system. In order to address the risk associated with personnel coming into contact with live wires the enclosure 10 is preferably made from a non-metallic material. In the preferred embodiment the security enclosure 10 is substantially metal free so as to mitigate the shock hazard posed by live wires. More about this is said below.

Figure 2:
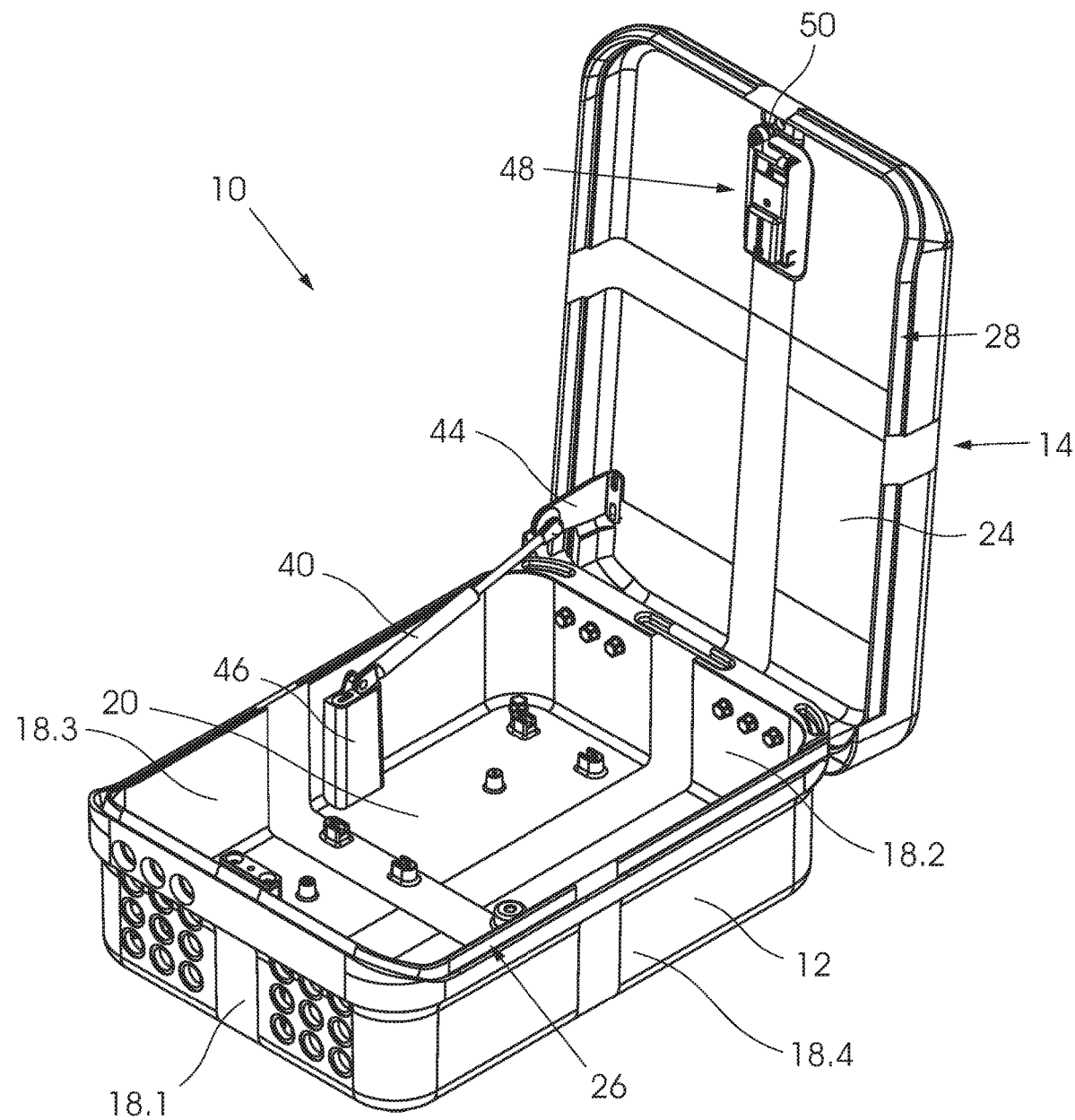
FIG. 2 shows a second front, top perspective view of the security enclosure of FIG. 1 with its cover in its open position.
Figure 5:
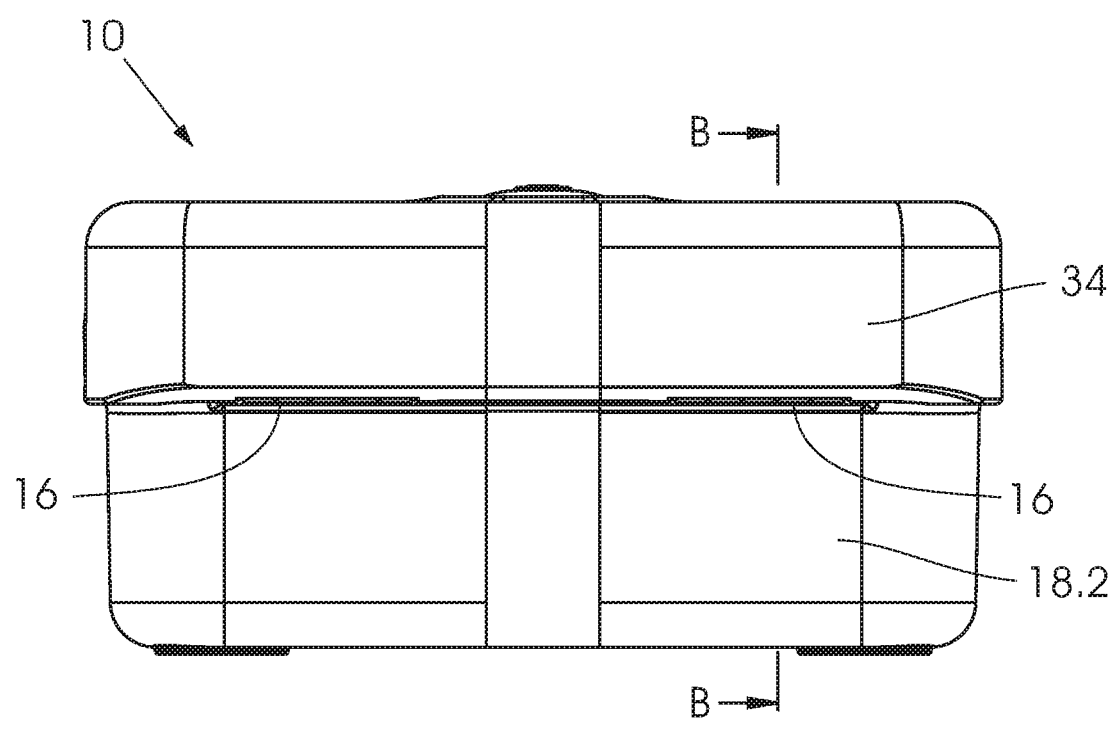
FIG. 5 shows a rear view of the security enclosure of FIG. 1.
Figure 6:
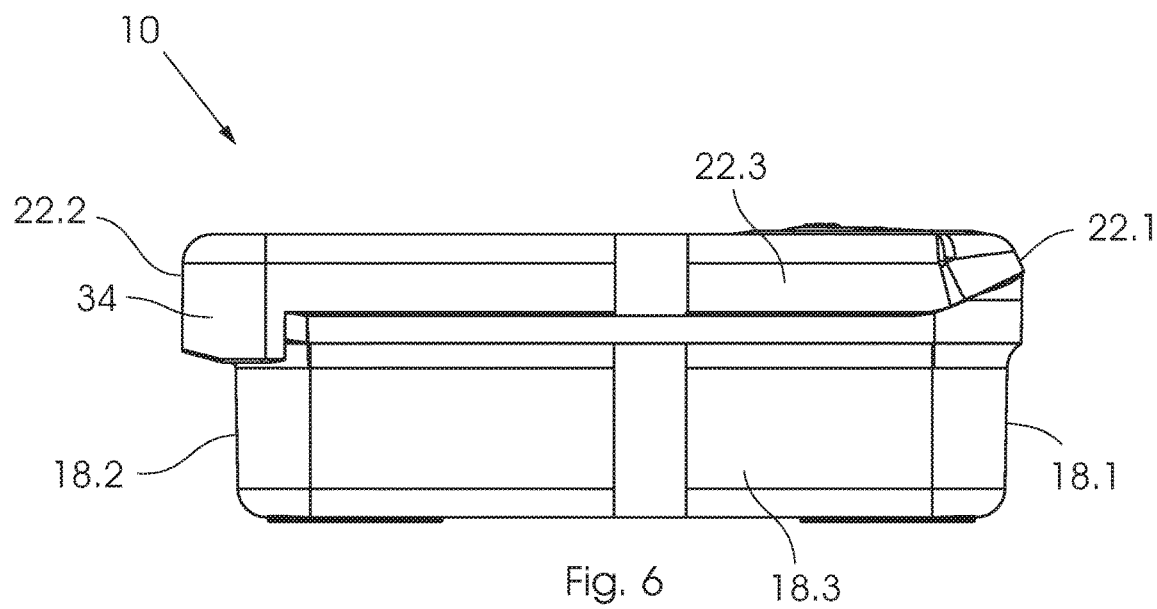
FIG. 6 shows a left side view of the security enclosure of FIG. 1.
Figure 7:
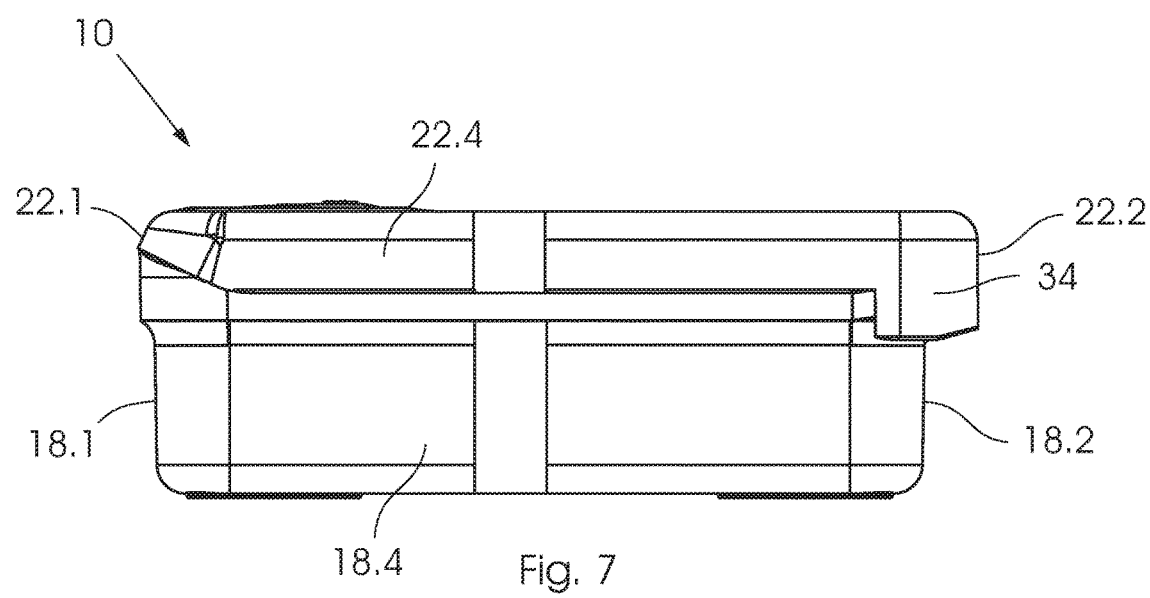
FIG. 7 shows a right side view of the security enclosure of FIG. 1.
Figure 8:
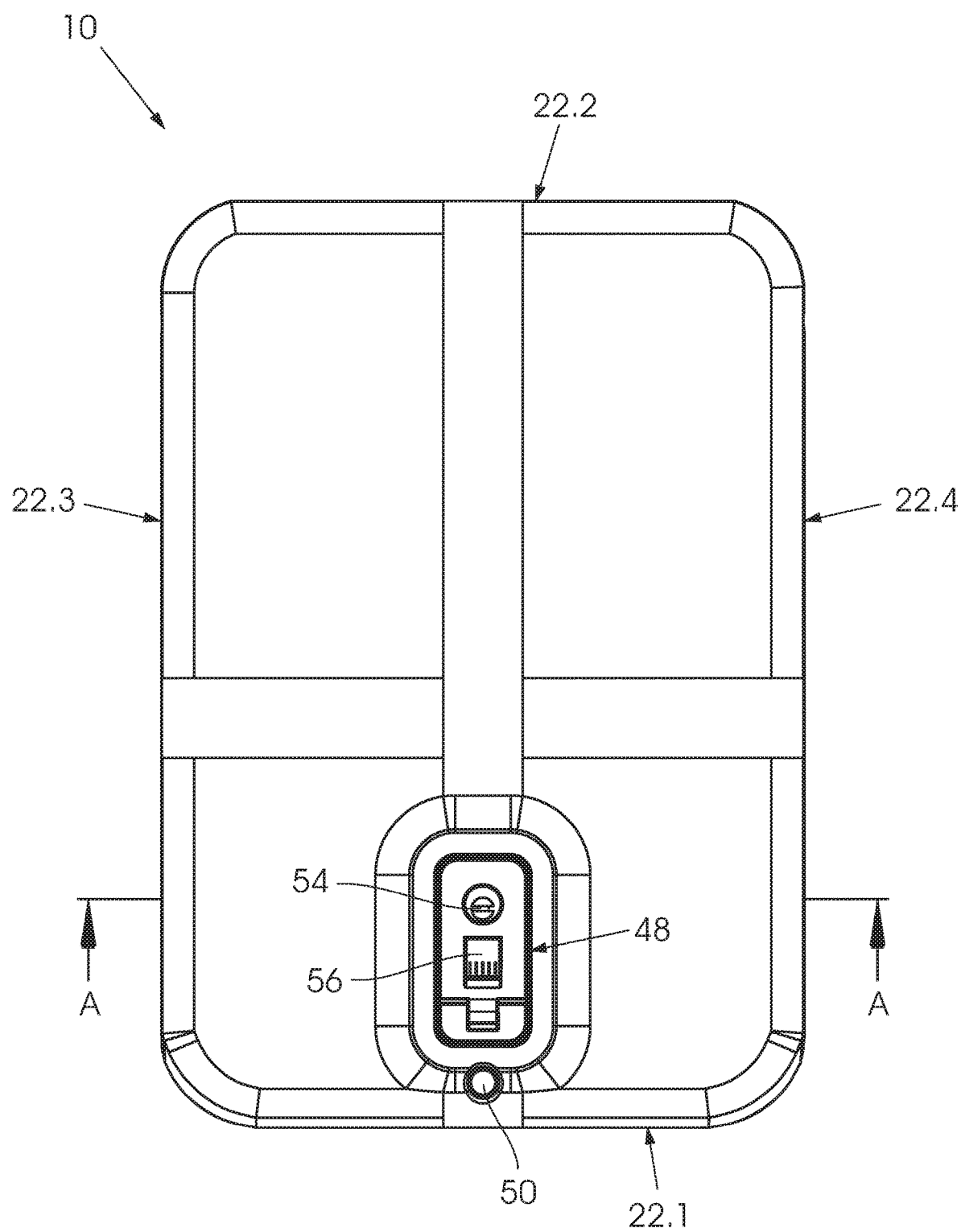
FIG. 8 shows a top view of the security enclosure of FIG. 1.

Turning now to the accompanying drawings it can been seen that the security enclosure 10 includes a body 12 and a movable cover 14. The cover 14 is connected to the body 12 using connecting means that allows the cover to be movable between a first, closed position, as shown in FIG. 1, wherein the security enclosure 10 is closed and a second, open position, as shown in FIG. 2, wherein the security enclosure is open. Probably best seen in FIGS. 5 and 11 the connecting means is in the form of two hinges 16 that allow for pivotal movement of the cover 14 about a centre axis of the hinges.

Returning now to FIGS. 1 and 2 it can be seen that the body 12 is substantially rectangular in shape and has two sets of opposed ends or sides. The first set of opposed ends are, in use, its front and rear ends 18.1 and 18.2 respectively. The second set of opposed ends are, in use, its longitudinal sides 18.3 and 18.4 respectively. All four ends or sides 18.1 to 18.4 protrude from a base 20. In use, the contents of the security enclosure 10, such as the electrical equipment, are mounted on the base 20.

The cover 14 is shaped complementally to the body 12 and, similarly to the body 12, has two sets of opposed ends or sides. The first set of opposed ends are, in use, its front and rear ends 22.1 and 22.2 respectively. The second set of opposed ends are, in use, its longitudinal sides 22.3 and 22.4 respectively. All four ends or sides 22.1 to 22.4 protrude from a substantially flat cover panel 24.

The four respective ends or sides 22.1 to 22.4 of the cover 14 are shaped to engage the corresponding sides 18.1 to 18.4 of the body 12 in such a manner that a mechanical seal is created between the body 12 and cover 14 when the cover is in its closed position. In particular, the body 12 and cover 14 carry complementary shaped engagement formations 26 and 28 respectively that engage one another so as to create the mechanical seal between the body and cover when the cover is in its closed position. In the security enclosure 10 the engagement formations 26 and 28 run along at least a major portion of the periphery of the body 12 and cover 14. In the illustrated embodiment the engagement formations 26, 28 are in the form of at least one ridge which is received in a complementary shaped groove when the body and cover engage each other. The ridge 26 is located on the cover 14 and is carried by the front end 22.1 and two opposed sides 22.3 and 22.4. The groove 28 is located on the body 12 and is carried by corresponding front end 18.1 and two opposed sides 18.3 and 18.4. In use, when the cover 14 is in its closed position the ridge 26 extends into the groove 28 so that their contact surfaces engage one another to create the mechanical seal between the cover 14 and body 12. The ridge 26 and groove 28 run continuously so as to create a continuous mechanical seal around the three sides of the body 12 and cover 14.

Although the illustrated embodiment shows the ridge 26 on the cover 14 and the groove 28 on the body 12, it should be understood that in an alternative embodiment not illustrated in the drawings the ridge could be located on the body and the groove on the cover.

Figure 10:
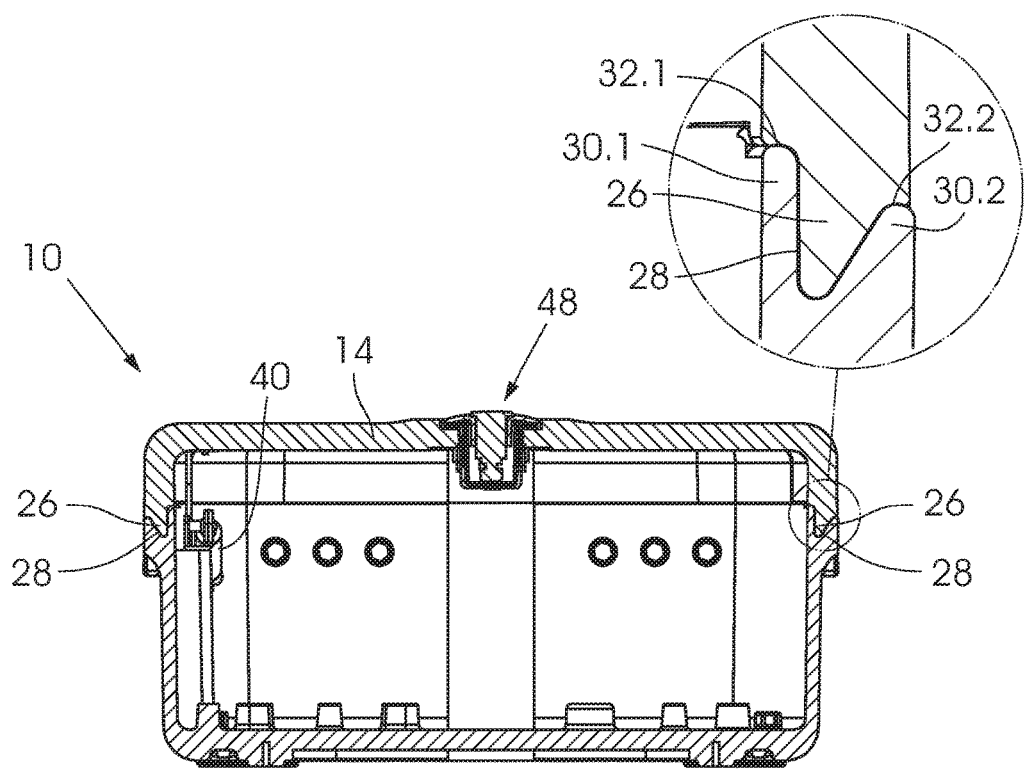
FIG. 10 shows a cross-sectional view of the security enclosure of FIG. 1 taken along A-A as shown in FIG. 8.

Returning to the illustrated embodiment, the engagement or contact surfaces of the engagement formations 26 and 28 create an interface between the body 12 and cover 14 when the cover is in its closed position. In the preferred embodiment of the security enclosure 10 the interface between the body 12 and cover 14 is concealed so as to obstruct, preferably prevent, access thereto. The interface between the cover 14 and body 12 is concealed due to the shape and configuration of the engagement formations 26 and 28. Referring to FIG. 10, the body 12 has an internal and external rim 30.1 and 30.2 between which the groove 28 is located. In use, when the cover 14 is in its closed position the rims 30.1 and 30.2 abut complementary shaped shoulders 32.1 and 32.2 located on either side of the ridge 26 carried by the cover 14. The contact surfaces of the rims 30.1, 30.2 and shoulders 32.1, 32.2 are in such close proximity to one another that a tool cannot be inserted between them to pry them open. It is further believed that the rounded or curved contours or profiles of the contact surfaces between the body 12 and cover 14, in particular between the rims 30.1, 30.2 and shoulders 32.2, 32.2 and ridge 26 and groove 28 respectively, enhance the integrity of the mechanical seal created by them. Not only does the enhanced mechanical seal improve security but it also improves the enclosure's ability to prevent dust and water from entering.

The rear end 22.2 of the cover 14 carries an exaggerated lip or obstructing formation 34. The obstructing formation 34 is said to be exaggerated in that it extends beyond the lip of the cover 14 defined by the sides 22.1, 22.3 and 22.4. The obstructing formation 34 is exaggerated in order to conceal, at least partially, the hinges 16 carried on the body 12. It should be understood that the obstructing formation 34 should conceal the hinges 16 while at the same time allow for movement of the cover 14 between its open and closed positions. Accordingly, the obstructing formation or lip 34 is shaped so as to conceal the hinges 16 without coming into contact with the body 12 when moving the cover 14 between its open and closed positions.

Figure 11:
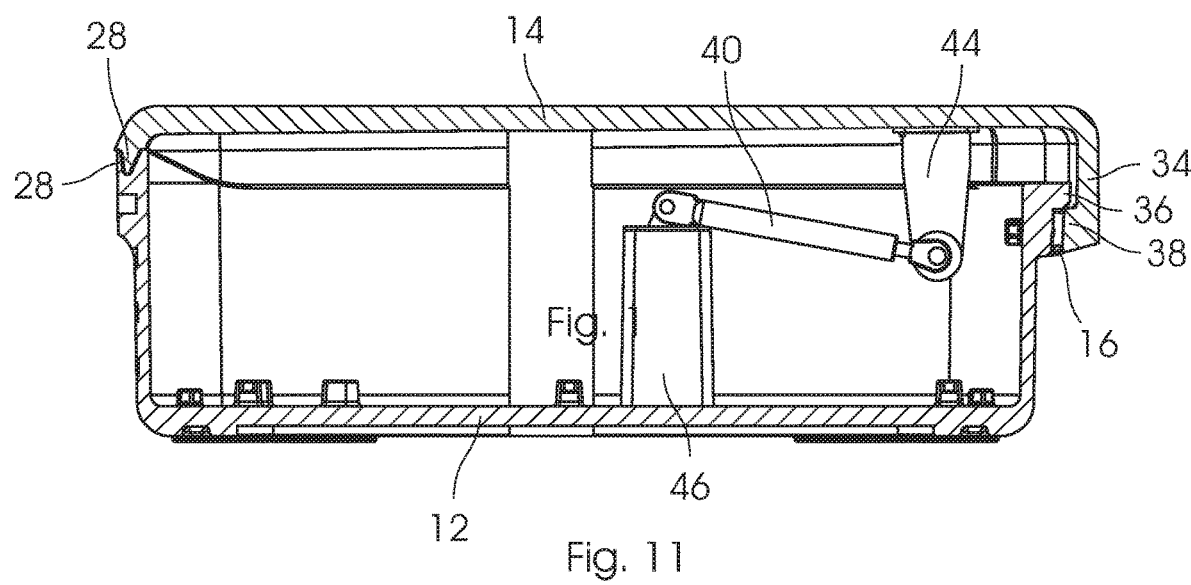
FIG. 11 shows a cross-sectional view of the security enclosure of FIG. 1 taken along B-B as shown in FIG. 5.

Turning now to FIG. 11, which shows a cross-sectional view taken along the longitudinal length of the security enclosure 10, it can be seen that the hinges 16 are attached to the rear wall 18.2 of body 12 and the exaggerated lip of the rear wall 22.2 of the cover 14. Both the body 12 and cover 14 are reinforced in the regions where the hinges 16 are located. In the illustrated embodiment the reinforcement is in the form of increased thickness of the body 12 and cover 14, particularly the rear wall 18.2 and the exaggerated lip 34.

Figure 12:
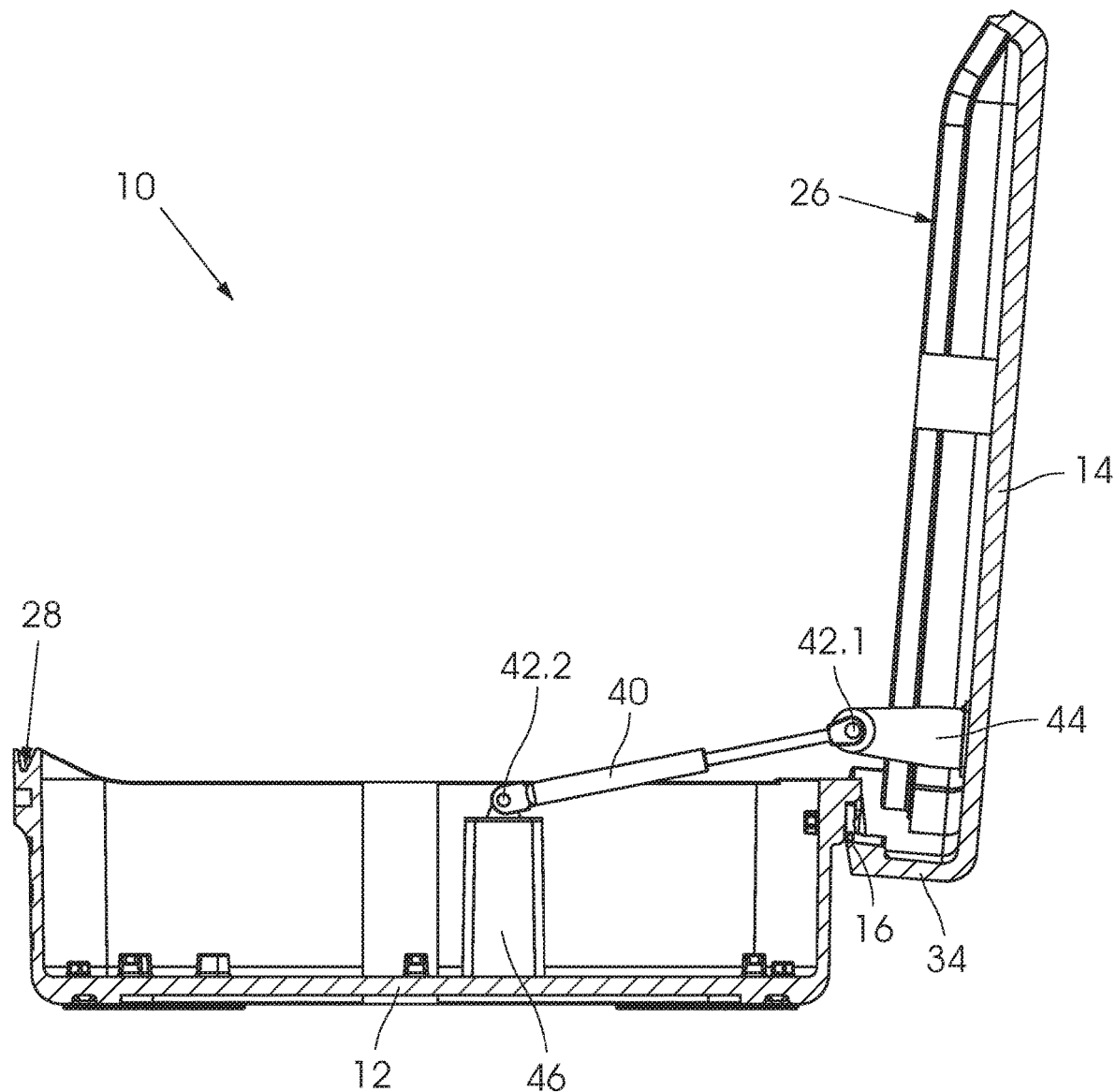
FIG. 12 shows a cross-sectional view of the security enclosure of FIG. 1 taken along the length of the enclosure, in which the enclosure is shown in its open configuration.

Referring to FIGS. 11 and 12, the body 12 and cover 14 also carry retaining formations for retaining the cover 14 on the body 12 when the cover is in its closed position. The retaining formations are in the form of protrusions protruding substantially perpendicularly from the rear walls 18.2 and 22.2 of the body and cover respectively. The retaining formations on the body 12 and cover 14 are indicated by the numerals 36 and 38 respectively. From FIG. 11 it can be seen that the retaining formations 36, 38 on the body 12 and cover 14 protrude in substantially opposite directions such that they obstruct free movement between the cover 14 and body 12. The advantage of the retaining formations 36, 38 is that they prevent the cover 14 from being moved relative to the body 12 in a direction that would otherwise have lifted the cover 14 off of the body 12 when the cover 14 is in the closed position. In other words, the retaining formations 36, 38 secure the cover 14 to the body 12 so as to prevent the cover 14 from being lifted off of the body 12. As shown in FIG. 11 the formations 36 and 38 extend past each other so that the formation 36 on the body 12 prevents the formation 38 on the cover from being moved in an upwardly direction. In other words, the retaining formations 36, 38 overlap in that their extremities extend past one another. This allows the cover 14 to be secured to the body 12 even in the event that the hinges 16 are compromised. In the embodiment illustrated in the drawings the reinforced region of the exaggerated lip 34 defines the retaining formation 38 of the cover 14. The retaining formations 36, 38 are integrally formed with the sides 18.2 and 22.2 of the body 12 and cover 14 respectively. In particular, the retaining formations 36, 38 are in the form of enlarged sections of the body 12 and cover 14 respectively.

From the above description of the body 12 and cover 14 it should be clear that they create an obstruction that substantially conceals the mechanical seal created between them when the cover is in its closed position, thereby obstructing access to the interface between the body and cover where the mechanical seal is located.

In one embodiment of the security enclosure 10 the mechanical seal is such that at least an IP Level 65 is achieved. In the preferred embodiment, an IP Levels 66 is achieved between the cover 14 and body 12.

The security enclosure 10 further includes a stay 40 (FIG. 2) for holding the cover in its open position. The stay 40 is in the form of a pneumatic stay which is movable between a first, supporting position wherein the cover 14 is supported in its open position and a second, contracted position wherein the cover is in its closed position. The stay 40 is shown in its supporting position in FIGS. 2 and 12, in which the cover 14 is prevented from collapsing from its open position to its closed position. The stay 40 can be seen in its contracted position in FIGS. 10 and 11. An end 42.1 of the stay 40 is connected to the cover 14 by means of a support 44. Similarly, an end 42.2 of the stay 40 is connected to the base 20 of body 12 by means of a support 46. The stay 40 and supports 44 and 46 are designed such that the cover 14 remains in its open position under bias of the stay. In other words, the cover 14 is moved against the bias of the stay 40 when moving it from its open position to its closed position. It should be understood that the stay 40 is therefore self-locking and automatically deployed as the security enclosure 10 is opened. In order to move the cover 14 from its open position to its closed position a user has to overpower the bias of the stay 40 manually.

The security enclosure 10 further includes locking means for locking the cover 14 in its closed position. In the illustrated embodiment the locking means is in the form a mechanical lock 48. The mechanical lock 48 has a coded nut 50 which is, in use, covered by a magnetic cap (not shown in the accompanying drawings). The magnetic cap fits onto the coded nut, and preferably over the coded nut, so that access to the nut is obstructed when the magnetic cap is located on the nut. In other words, the magnetic cap has to be removed before access can be gained to the nut 50. In the preferred embodiment the coded nut forms part of a series of specialised nuts which can only be engaged using a complementally shaped tool (not shown in the drawings). It is envisaged that the series of specialised nuts could include a number of variants. For example, it is envisaged that around a thousand variations of the coded nut could be used, each requiring its unique, matching tool in order to be unlocked and locked. Authorised personnel would have a register of all enclosures 10 that provides detail on which variation of the coded nut is used on each of the enclosures, thereby allowing only authorised personnel to take the corresponding tool when having to gain access to a particular enclosure.

In the illustrated security enclosure 10 the mechanical lock 48 includes a second lock 52 which is operable between its locked and unlocked configurations using a key (not shown in the drawings). In use, the lock 52 is unlocked by inserting a key into a key slot 54 prior to operating a latch 56. The latch 56 is in turn operable between a locked and unlocked positions by depressing it manually. When the latch 56 is in its released position the cover 14 may be opened. The procedure is followed in reverse when the locking the security enclosure 10. For example, the cover 14 is moved into its closed position and the latch 56 is pressed in order to move it to its locked position. Thereafter, the key is used to lock the second lock 52 by inserting it into the keyhole 54 and subsequently rotating it. Next, the coded nut is inserted into its opening in the cover 14 and tightened using the coded tool. Finally, the magnetic cap is placed over the coded nut 50.

In another embodiment of the security enclosure of the invention not illustrated in the drawings, the locking means provides for central access control and tracking. In this embodiment the locking means include a dock and trace key system that allows central tracking on a cyclical basis, such as a weekly basis, for example.

In yet another embodiment of the security enclosure of the invention not illustrated in the drawings, the locking means forms part of a live GPS based access control system. In this embodiment of the security enclosure the locking means is in the form of a GridLock Access Management (GLAM) lock that is operable using a smart key, which is tracked using GPS. The smart key is connectable to communication devices, such as GSM enabled devices, preferably smartphones and tablets, for communication with a centralised management platform. The GLAM lock may be an encapsulated electronic dead lock, which requires no power connection or communication infrastructure. The GLAM lock is energised by the smart key, which communicates with the lock by way of an encrypted proprietary inductive communication circuit.

Figure 3:
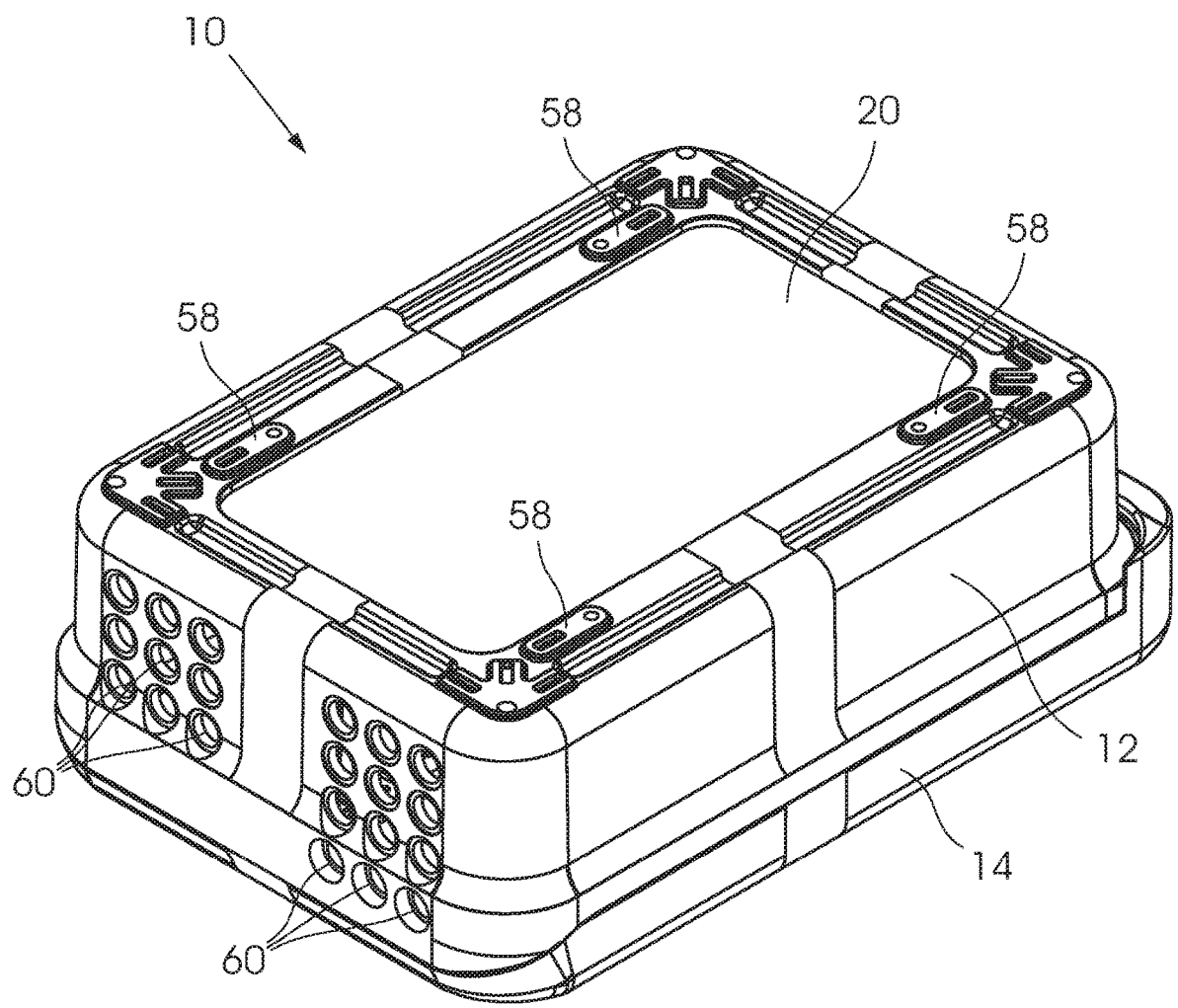
FIG. 3 shows a front, bottom perspective view of the security enclosure of FIG. 1.
Figure 4:
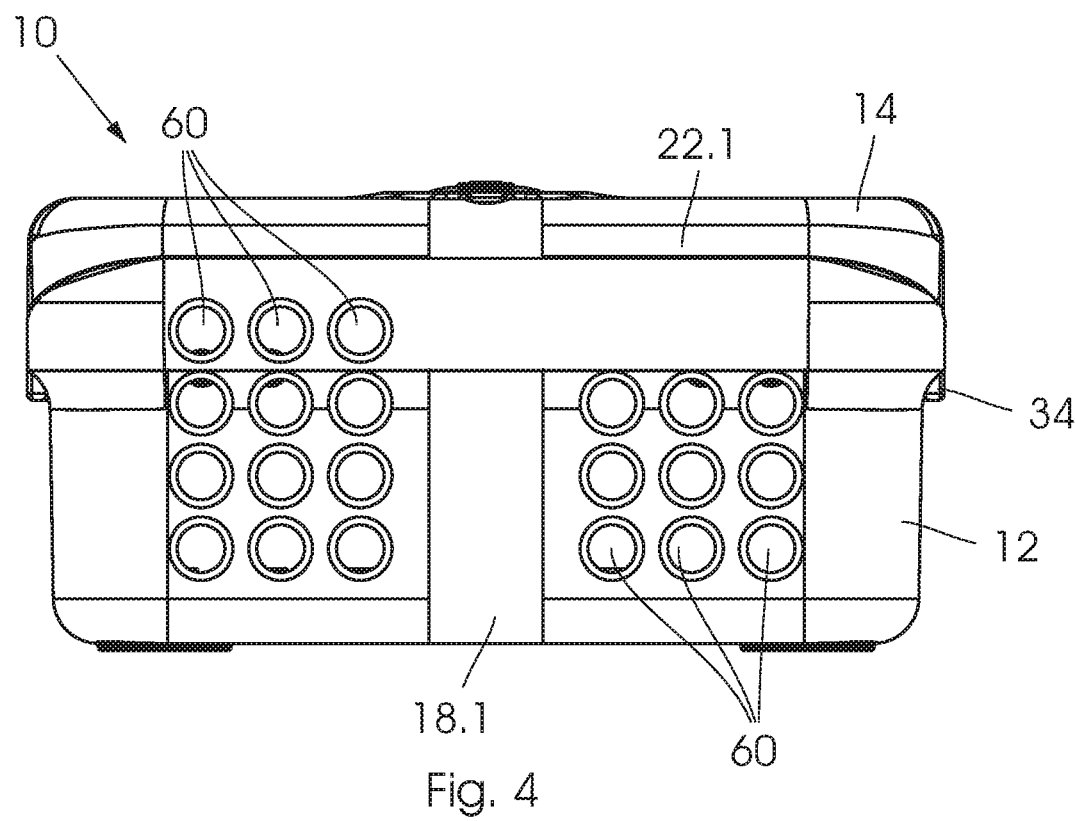
FIG. 4 shows a front view of the security enclosure of FIG. 1.
Figure 9:
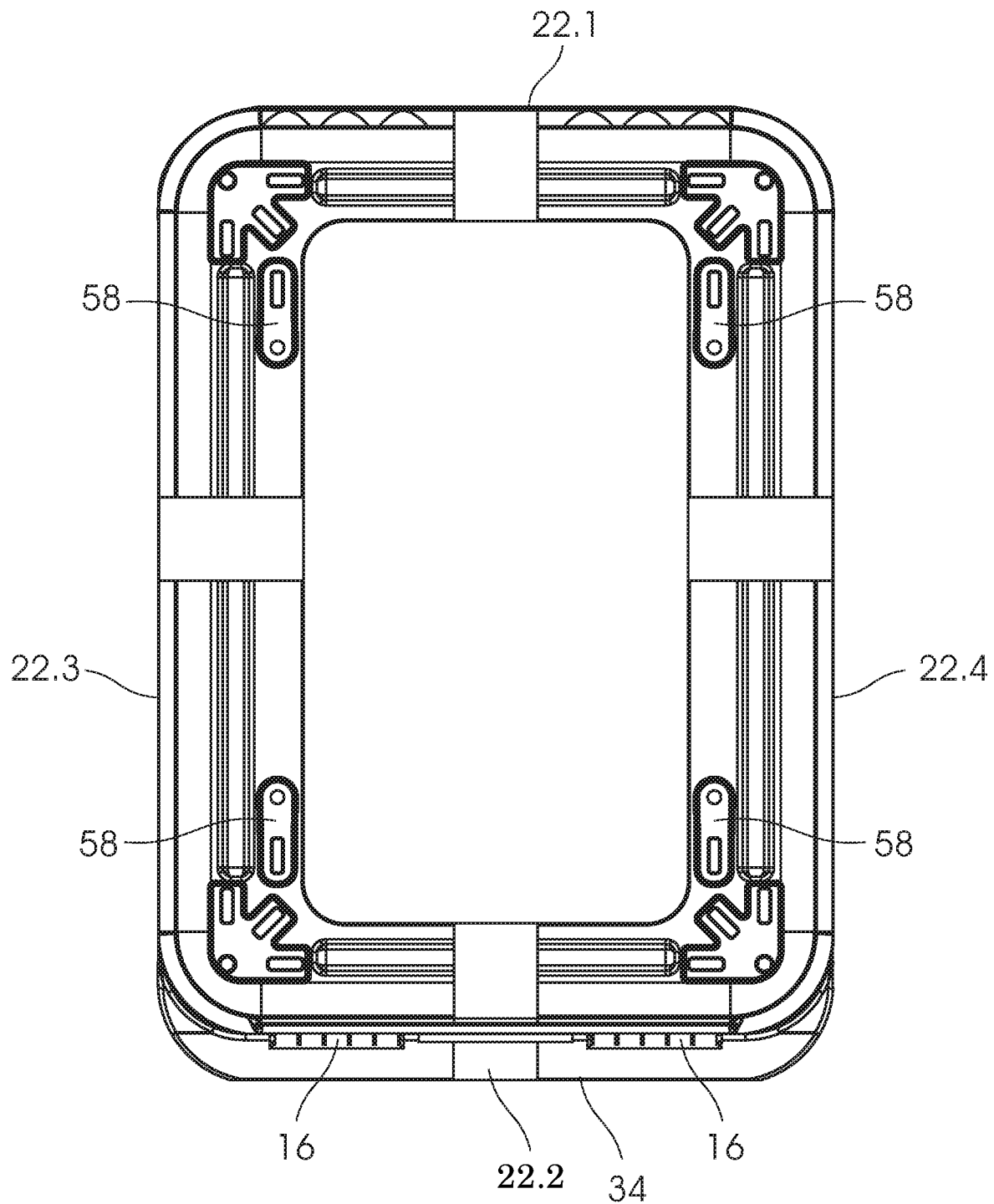
FIG. 9 shows a bottom view of the security enclosure of FIG. 1.

In use, the security enclosure 10 may be either wall mounted or pole mounted. Probably best seen in FIGS. 3 and 9, the security enclosure 10 includes a sets of mounting arrangements, which includes a number of formations 58, preferably four, for wall-mounting the security enclosure 10. Each formation 58 may have an area of weakness through which a fastener extends, in use. The area of weakness is typically in the form of a thin layer of the composite material from which the security enclosure 10 is manufactured. At least a portion of the area of weakness is pierced or punched out to allow a fastener to pass through the mounting formation so as to secure the security enclosure to the wall, for example.

Although not illustrated in the accompanying drawings the security enclosure 10 is typically transported in a box, preferably made from a material such as cardboard. The advantage of using a box that provides sufficient rigidity is that it can be used to mount the security enclosure 10 against a wall or pole, for example. It is envisaged that the box could have attachment points, such as hoisting hooks, for attaching hoisting equipment, for example. In use, the hoisting equipment is attached to the box so that the box together with the security enclosure 10 carried therein are hoisted to the desired position. It is envisaged that the required bracket(s) and/or fastener(s) required to mount the security enclosure 10 could already be attached to the security enclosure. While still in the box, the security enclosure 10 could then be fixed in place at the desired position before the box is removed. This process has the advantage that the security enclosure 10 is protected by the box during the installation process, thereby providing protection against being damaged. Alternatively, the hoisting hooks could be added to a first part of the mounting bracket that is fixed to the box or directly to the security enclosure 10 prior to mounting a second part of the mounting bracket to the wall, for example. In use, the second part of the wall mounting bracket can be fixed to the wall whereafter the enclosure 10, together with the first part of the wall mounting bracket, can be latched onto the second part of the bracket. The enclosure 10 will be suspended from the second part of the bracket without having to hold it in place, thereby making it possible for the installer to use both hands to secure the retaining fasteners on the inside of the enclosure 10.

The pole mounting brackets are a further extension of the wall mounting bracket and are fixed to the wall mounting bracket before fixing the assembly to the pole whereafter the same mounting procedure described above is followed.

It is further envisaged that the security enclosure 10 will find particular application in securing electronic and/or electrical components. Accordingly, the illustrated security enclosure 10 carries multiple openings or passages 60 through which access can be gained into the interior of the enclosure. It is believed that electrical components such as wires (not shown) could, in use, pass through these access openings for connection to the components housed within the enclosure 10. As shown in the accompanying drawings the access openings 60 may be located in both the body 12 and cover 14. The number of access openings is also not limited and may vary according to the particular application of the security enclosure 10 in use. The openings 60 may be covered typically by a thin or weakened piece of material that is punched out to create the openings as required.

The security enclosure 10 is preferably manufactured from a non-metallic material, such a fibreglass reinforced polyester, for example. The fibreglass reinforced polyester is a non-flammable composite and provides excellent impact resistance. An advantage of the security enclosure 10 in accordance with the invention is that it is not susceptible to being vandalised by setting it alight. Another advantage of the security enclosure 10 is that, due to the design of the locking interface between the cover 14 and body 12, the cover 14 cannot be removed from the body 12 unless the lock is either unlocked or compromised. As mentioned above, even when the hinges 16 are compromised the cover 14 remains locked to the body 12 as a result of the retaining formations, i.e. the overlocking design.

Yet another advantage of the security enclosure 10 is that, due to the mechanical seal created between the body 12 and cover 14, no gasket is required in order to achieve the necessary IP Levels. The sealing abilities of the cover 14 on the body 12 is also improved by concealing the sealing interface between the body and cover. The concealed interface also assists in vandal proofing the security enclosure 10.

From the above it should be clear that the security enclosure 10 aims to address the design challenges referred to above.

It will be appreciated that the above describes only some embodiments of the invention and that there may be many variations without departing from the spirit and/or the scope of the invention. It is easily understood from the present application that the particular features of the present invention, as generally described and illustrated in the figures, can be arranged and designed according to a wide variety of different configurations. In this way, the description of the present invention and the related figures are not provided to limit the scope of the invention but simply represent selected embodiments.

The skilled person will understand that the technical characteristics of a given embodiment can in fact be combined with characteristics of another embodiment, unless otherwise expressed or it is evident that these characteristics are incompatible. Also, the technical characteristics described in a given embodiment can be isolated from the other characteristics of this embodiment unless otherwise expressed.

The invention claimed is:

1. A non-metallic security enclosure including:
   a body;
   a cover which is connected to the body using connecting means such that the cover is movable between a first, closed position wherein the security enclosure is closed and a second, open position wherein the security enclosure is open;
   locking means for locking the cover in its closed position;
   complementary shaped engagement formations carried by the body and cover that engage one another along at least a major portion of the periphery of the body and cover to create a mechanical seal between the body and cover when the cover is in its closed position;
   retaining formations carried by the body and cover respectively, the retaining formations defining a locking interface between the cover and body to prevent the cover from being removed from the body when the cover is in its closed position unless the locking means is either unlocked or compromised, thereby securing the cover to the body even if the connecting means have been compromised;
   wherein the cover has an obstructing formation that defines the retaining formation carried by the cover; and
   wherein the obstructing formation extends beyond the locking interface between the body and cover, thereby concealing, at least partially, the connecting means connecting the body and cover to one another.

2. A security enclosure according to claim 1, wherein the obstructing formation is in the form of an exaggerated lip which at least partially conceals the connecting means connecting the body and cover to one another.

3. A security enclosure according to claim 2, wherein the connecting means is in the form of at least one hinge, and wherein the lip is carried by a rear edge of the cover such that it extends at least partially over the hinge so that access to the hinge is obstructed by the lip.

4. A security enclosure according to claim 1, wherein the engagement formations are in the form of at least one ridge which is received in a complementary shaped groove when the body and cover engage each other, wherein the engagement formation defining the groove has an internal rim and an external rim between which the groove is located, and wherein the engagement formation defining the ridge has shoulders which are shaped complementary to the internal and external rims.

5. A security enclosure according to claim 4, wherein the profiles of the contact surfaces between the engagement formations are curved so as to enhance the integrity of the mechanical seal created by them.

6. A security enclosure according to claim 1, wherein the mechanical seal created by the complementary shaped engaging formations is free from a gasket.

7. A security enclosure according to claim 1, wherein the mechanical seal created by the complementary shaped engaging formations is IP Level 66 compliant.

8. A security enclosure according to claim 1, wherein the locking means is in the form a mechanical lock that includes a coded nut and a magnetic cap which, in use, fits over the coded nut such that access to the coded nut is only gained once the magnetic cap is removed.

9. A security enclosure according to claim 8, wherein the locking means includes a second lock.

10. A security enclosure according to claim 9, wherein the second lock is key operated.

11. A security enclosure according to claim 1, wherein the locking means provides for central access control and tracking.

12. A security enclosure according to claim 11, wherein the locking means includes a dock and trace key system that allows for tracking from a central location.

13. A security enclosure according to claim 12, wherein the locking means is in the form of a GridLock Access Management (GLAM) lock that is operable using a smart key that is tracked using GPS.

14. A security enclosure according to claim 13, wherein the smart key is connectable to mobile communication devices for communication with a centralised management platform.

15. A security enclosure according to claim 1, wherein the locking means forms part of a live GPS based access control system.

16. A security enclosure according to claim 1, wherein the security enclosure is manufactured from fibreglass reinforced polyester.

17. A security enclosure according to claim 1, including a stay for holding the cover in its open position, wherein the stay includes a pneumatic cylinder which is movable between a first, supporting position wherein the cover is supported in its open position and a second, contracted position wherein the cover is in its closed position, and wherein the stay is biased to its locking position such that it automatically holds the cover in its open position when opening the cover.

18. A security system including:
   a number of security enclosures according to claim 1, wherein the locking means of each enclosure is coded;
   a number of coded tools for operating the coded locking means, wherein the coded tools correspond to the number of coded locking means such that each uniquely coded locking means has a corresponding tool for operating the coded locking means between its locked and open states; and
   a database containing information for mapping the security enclosures and their coded locking means against the corresponding coded tool required to operate the locking means of each security enclosure.

19. A security system according to claim 18, wherein the locking means includes a coded nut and wherein the coded tool is a complementary shaped mechanical tool for engaging the coded nut.

20. A security system including a number of security enclosures according to claim 1, wherein the locking means is in the form of a GridLock Access Management (GLAM) lock that is operable using a smart key that is connectable to a mobile communication device for communication with a central access control system for controlling access to the security enclosures based on the geographic data of the smart key and/or mobile device.

* * * * *